US000001095H

United States Statutory Invention Registration [19]

[11] Reg. Number: H1095

Morgan

[43] Published: Aug. 4, 1992

[54] COOLED, TEMPERATURE CONTROLLED ELECTROMETER

[75] Inventor: John P. Morgan, Idaho Falls, Id.

[73] Assignee: The United States of America as represented by the United States Department of Energy, Washington, D.C.

[21] Appl. No.: 697,044

[22] Filed: May 8, 1991

[51] Int. Cl.[5] ..... G01N 27/60; G01R 31/02

[52] U.S. Cl. ..... 324/452; 324/72; 324/458; 250/283

[58] Field of Search ..... 324/452, 454–458, 324/72, 72.5, 105; 250/281–283

[56] References Cited

U.S. PATENT DOCUMENTS

| | | | |
|---|---|---|---|
| 2,709,753 | 5/1955 | Krasnow et al. | 324/105 |
| 4,370,615 | 1/1983 | Whistler et al. | 324/457 |
| 4,883,957 | 11/1989 | Kinge et al. | 250/281 X |

*Primary Examiner*—Bernarr E. Gregory
*Attorney, Agent, or Firm*—John M. Albrecht; Bradley W. Smith; William R. Moser

[57] ABSTRACT

A cooled, temperature controlled electrometer for the measurement of small currents. The device employs a thermal transfer system to remove heat from the electrometer circuit and its environment and dissipate it to the external environment by means of a heat sink. The operation of the thermal transfer system is governed by a temperature regulation circuit which activates the thermal transfer system when the temperature of the electrometer circuit and its environment exceeds a level previously inputted to the external variable temperature control circuit. The variable temperature control circuit functions as subpart of the temperature control circuit. To provide temperature stability and uniformity, the electrometer circuit is enclosed by an insulated housing.

5 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

COOLED, TEMPERATURE CONTROLLED ELECTROMETER

CONTRACTUAL ORIGIN OF THE INVENTION

The United States Government has rights in this invention pursuant to Contract No. DE-AC07-84-ID-12435 between the U.S. Department of Energy and Westinghouse Electric Corporation.

BACKGROUND OF THE INVENTION

Electrometers are instruments for measuring electric charge and thus, can be configured to measure either small voltages or currents. The present invention is an instrument for measuring small currents.

The input bias current for a solid state electrometer is a function of the operating temperature, and for field effect transistors, the usual devices used in a solid state electrometer, the input bias current doubles for every 10 degree centigrade increase in operating temperature. Since the input bias current for solid state electrometers is a measure of the lower limit of the electrometer's current measuring sensitivity, lowering the input bias current has the effect of permitting the measurement of lower currents. Normal laboratory operating temperature is twenty degrees centigrade; therefore, by reducing the operating temperature of the instrument to ten degrees centigrade the bias current is decreased by a factor of two. However, one of the problems associated with lowering the temperature of the electrometer is that the reduction of temperature leads to the formation of condensation on the instrument which in turn can lead to instrument failure or compromised readings of the measured current.

Another temperature problem arises when different parts of the instrument are operating at different temperatures. These temperature differentials lead to the formation of thermoelectric voltages which can lead to significant errors for a low voltage device such as an electrometer. One way to minimize the presence of the temperature gradients, and thus, the formation of thermoelectric voltages, is to place all of the junctions in close proximity to each other and then, to provide an effective thermal couple linking the junctions to a common heat sink. This arrangement provides a more uniform and stable temperature distribution and thus, a more sensitive current measuring capability.

Ambient room temperature variations can also limit the precision of measurements made by an electrometer. The electrometer circuit needed to implement the measurement of a small current is directly dependent on the presence of a high ohmic value resistor, one having resistance values greater than 10 to the 10 ohms, within the circuit. Typically, high value resistors have temperature coefficients of resistivity of at least 0.1 percent per degree centigrade; thus, the resistance of a high value resistor with a value of 10 to the 10 ohms could be changed by 10 to the 7 ohms with an increase of one degree centigrade in the ambient temperature surrounding the electrometer circuit. Therefore, by lowering and stabilizing the temperature of the electrometer circuit the resistance of the high value resistor will remain at a constant value resulting in a greater capability of the electrometer circuit to measure small currents.

Finally, the electrometer amplifier input offset voltage is also a temperature sensitive element which effects the current measuring capability of the electrometer circuit. For this element, a reduction in the temperature variation through the employment of a temperature controlled environment also results in an improved current measuring capability.

Accordingly, it is an object of this invention to provide an electrometer which is thermally cooled below the ambient room temperature to provide an improved small current measuring capability.

It is still a further object of this invention to provide a temperature controlled environment for the electrometer so as to provide a uniform and stable temperature environment as compared to the less stable conditions experienced in a uncontrolled, room environment.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

SUMMARY OF THE INVENTION

To achieve the foregoing and other objectives and in accordance with the purposes of the present invention, as embodied and broadly described herein, the present invention provides for a means to cool and thermally control the temperature of an electrometer circuit and thus, to provide an instrument capable of measuring small currents. The electrometer circuit is cooled and maintained below ambient room temperature through the use of a small thermoelectric (Peltier) heat pump. To maintain the temperature of the electrometer below ambient temperature, the temperature of the electrometer is monitored by using a platinum resistance temperature detector linked to a temperature control circuit; the electrometer circuit is also enveloped with an insulating layer to retard heat flow to the circuit and to provide a stable and uniform thermal environment.

DETAILED DESCRIPTION OF THE INVENTION

The present invention provides a means for measuring small currents through the use of an electrometer operating at below ambient room temperature.

Figure 1A:
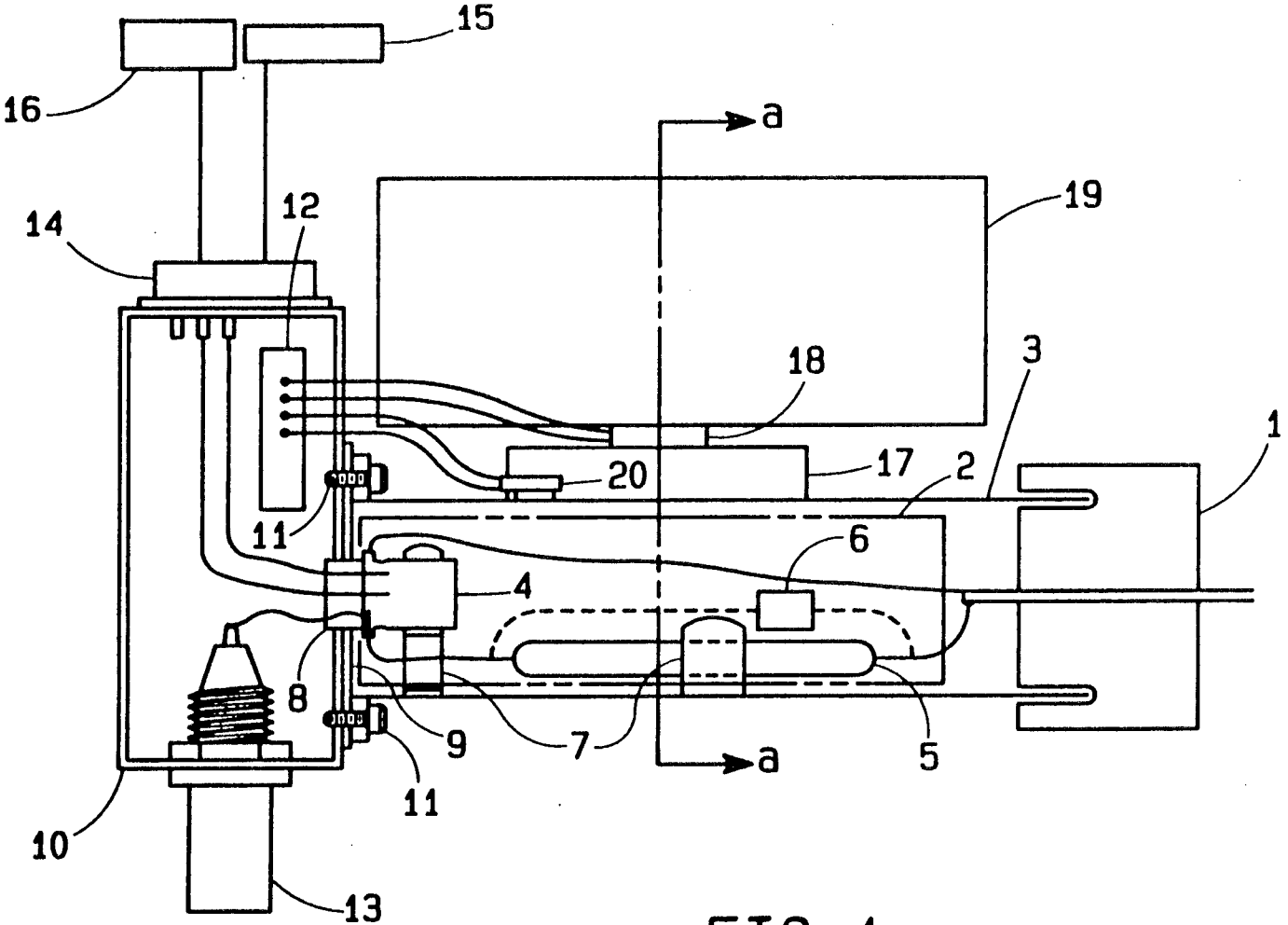
FIG. 1*a* depicts a side view of the cooled, temperature controlled electrometer.
Figure 1B:
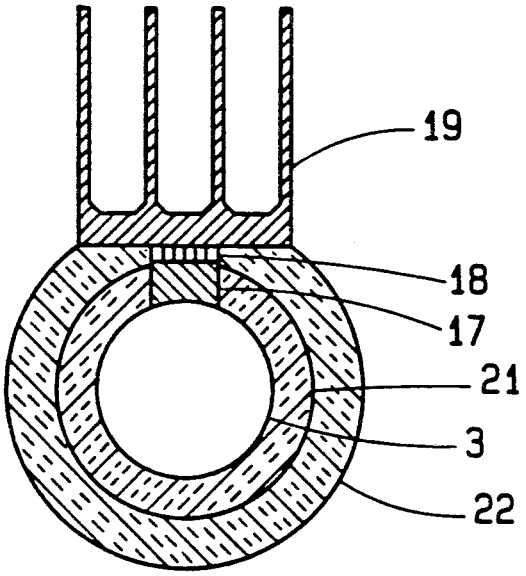
FIG. 1*b* depicts a cross sectional view of the cooled, temperature controlled electrometer taken along section line a—a.

FIG. 1*a* depicts a composite side view of the cooled, temperature controlled electrometer while FIG. 1*b* shows the cross sectional characteristics along section line a-a of the electrometer. A tetrafluoroethylene (TFE) fluorocarbon resin insulated input plug, 1, serves as the input port for the signal to be measured. The insulated input plug, 1, serves two purposes: first the plug provides the means to electrically connect an external source to the electrometer circuit, 2, while providing a high leakage resistance to ground (electrometer housing, 3), and second it provides a thermal barrier to seal off one end of the copper thermally conducting electrometer housing, 3, from the external environment which in this case is the ambient room environment. The electrometer housing, 3, serves as a conductor to draw heat away from the electrometer circuit, 2, and its environment while partially encompassing the electrometer circuit, 2. The components of the electrometer circuit, 2: an electrometer amplifier, 4; a high resistive impedance, 5; and a capacitor, 6, are held in position by thermally conducting clips, 7, which are used to help maintain the electrometer circuit, 2, at the regulated temperature. To perform this regulatory function, the clips, 7, are connected to the electrometer housing, 3, in a manner to provide a thermal link between the circuit, 2, and the electrometer housing, 3. A connecting plug, 8, is mounted on a glass epoxy circuit board, 9, which serves to electrically connect the electrometer circuit, 2, to the electrical component box, 10, and also, to thermally insulate the electrical component box, 10, from the electrometer housing, 3. The electrical component box, 10, is joined to the electrometer housing, 3, by means of a set of plastic screws, 11. The electrical component box, 10, houses a terminal bar, 12, for the temperature control circuit, FIG. 3, 26; an electrometer output connector, 13; and an external component connector, 14. The external component connector, 14, electrically connects an external temperature control circuit, 15, and an external power supply, 16, to their respective circuits.

FIGS. 1*a* and 1*b* also depict a thermal conducting copper block, 17, mounted on the electrometer housing, 3; this serves to conduct the heat away from the electrometer housing, 3. A thermoelectric (Peltier) cooler, 18, joins the copper block, 17, to an aluminum heat sink, 19, which dissipates the heat to the external environment. The thermoelectric (Peltier) cooler, 18, when activated, cools the copper block, 17, and heats the heat sink, 19. The thermoelectric (Peltier) cooler, 18, is electrically connected to the terminal bar, 12. A 1000 ohm at 0 degrees centigrade resistance temperature detector (RTD), 20, is mounted on the copper block, 17, and is electrically connected to the terminal bar, 12. The RTD, 20, serves to monitor the temperature of the copper block, 17, and thus, indirectly the temperature of the electrometer circuit, 2.

The sectional cross view, FIG. 1*b*, depicts the thermally conducting housing, 3, encased in a TFE insulator, 21, which is in turn encased in a layer of standard piping wrap around insulation, 22. The insulation serves to insulate the electrometer circuit, 2, and its environment from the influences of the external environment.

Figure 2:
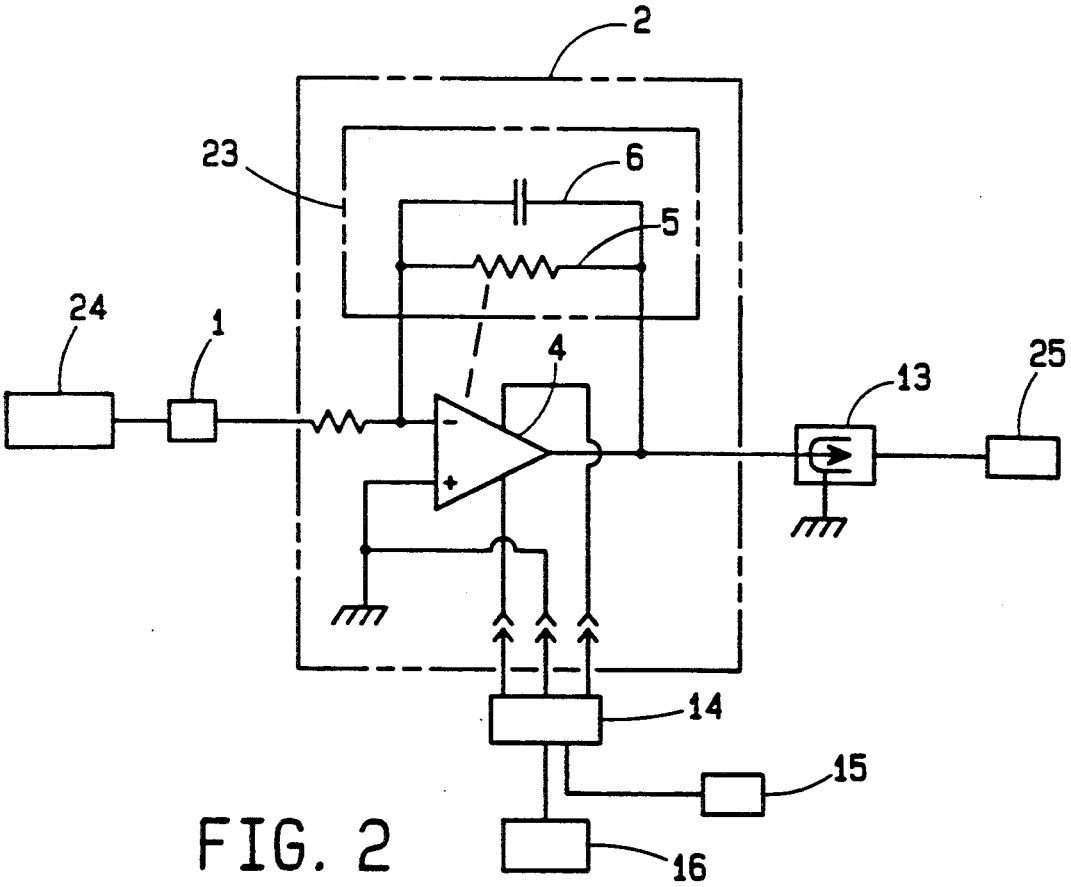
FIG. 2 shows a typical, commercially available electrometer amplifier for use in the electrometer circuit.

FIG. 2 depicts the electrometer circuit, 2. Power is supplied to the electrometer amplifier, 4, via the external component connector, 14, and an external power source, 16. A large resistance impedance, 23, is connected as the feedback element across the electrometer amplifier, 4. The thermally and electrically insulated input connector, 2, and an electrometer output connector, 13, electrically connect the electrometer circuit, 2, to external sources, 24, and receptors, 25.

Figure 3:
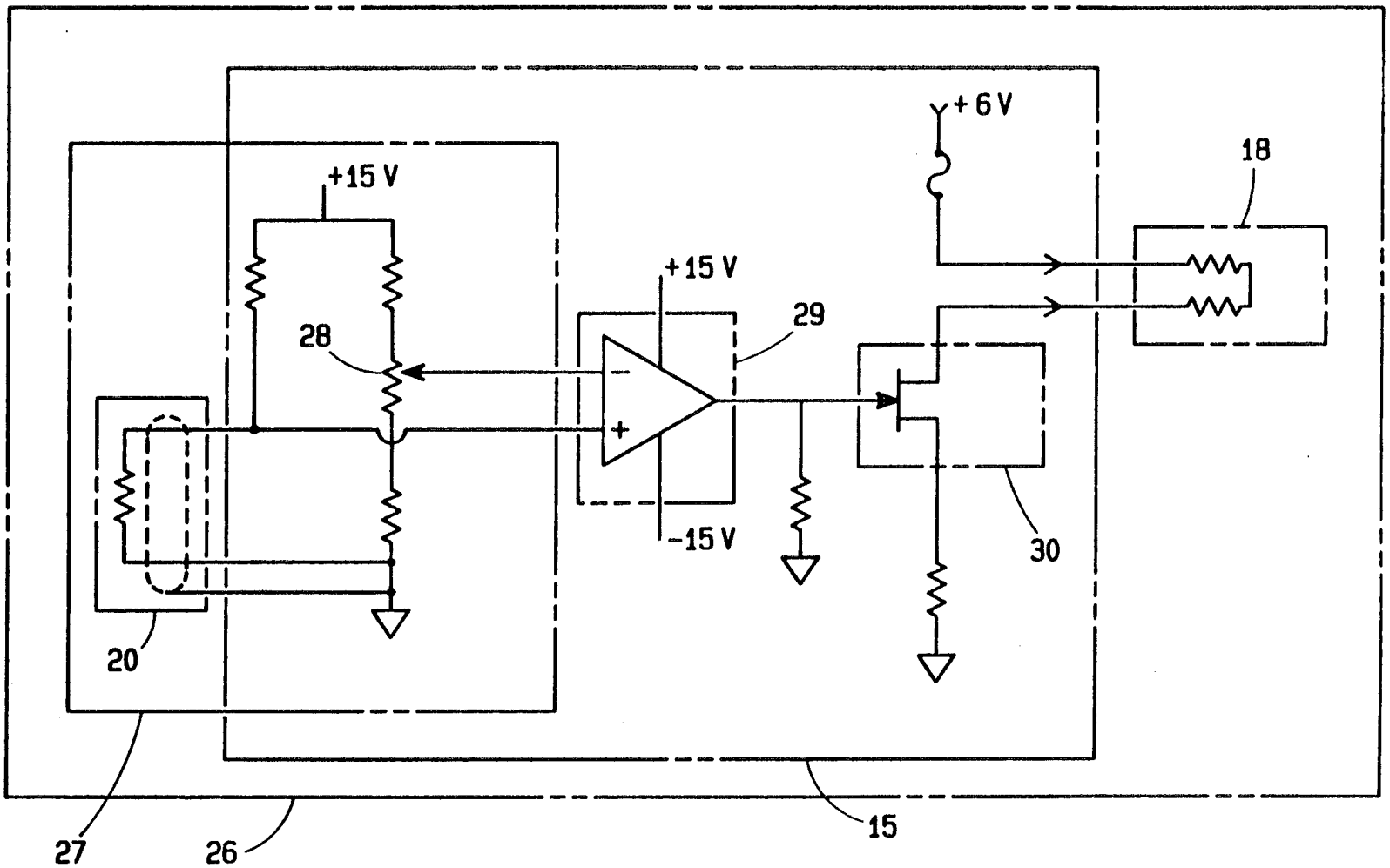
FIG. 3 shows the electronic schematic for the temperature sensing and control circuit associated with the cooled, temperature controlled electrometer.

FIG. 3 depicts the temperature control circuit, 26. The external variable temperature control circuit, 15, electrically controls the thermoelectric (Peltier) cooler, 18, in response to variations in resistance of the RTD, 20, brought on by changes in temperature. The RTD, 20, forms one leg of the RTD bridge, 27. The RTD bridge, 27, is balanced when the RTD resistance value, dependent on the temperature of the RTD, is equal to the pre-set resistance value of the resistor, 28, occupying the opposite leg of the bridge, 27. When the electrometer housing, 3, is not at the desired temperature, the bridge, 27, is unbalanced and a voltage is generated at the amplifier, 29, input terminals. The unbalanced voltage is amplified and changes the current through the thermoelectric (Peltier) cooler, 18, via the IRFD 210 MOSFET transistor, 30. The current flow through the thermoelectric (Peltier) cooler, 18, determines the amount of heat being pumped from the electrometer housing, 3, and therefore, determines the temperature of the housing, and thus, the temperature resulting from the thermal combination of the electrometer circuit, 2, and its environment. Heat pumped from the electrometer housing, 3, is dissipated by the small finned aluminum heat sink, 19, to the external environment.

The embodiments of the invention in which an exclusive property or privilege is claimed are defined as follows:

1. An electrometer system for the purpose of measuring small currents at temperatures less than ambient room temperature including an electrometer amplifier coupled to a high impedance to form an electrometer circuit, said system further comprising:

a thermal transfer system coupled to said electrometer circuit;

means for receiving a signal from an external source;

means for transmitting a signal from the electrometer circuit;

means for thermally coupling said electrometer circuit to said thermal transfer system where said thermal transfer system acts to cool said circuit by transferring heat from the electrometer circuit and its environment to an external environment;

means for regulating said thermal transfer system where said regulating means controls the temperature of said electrometer circuit by controlling the operation of said thermal transfer system; and means for thermally insulating said electrometer circuit where said insulating means inhibits the transfer of heat to the electrometer circuit while increasing the stability of the temperature variation to which the electrometer circuit is exposed.

2. The electrometer system of claim 1 in which said thermal transfer system includes a conducting block attached to the external surface of said electrometer housing;

a thermoelectric cooler linked to said conducting block; and a heat sink coupled to said thermoelectric cooler.

3. The electrometer system of claim 2 in which said means for regulating said thermal transfer system includes a resistance temperature detector coupled to said thermal conducting block, an external variable temperature control circuit coupled and responsive to said resistance temperature detector, and a means for coupling said external controller circuit to said thermoelectric cooler where said thermoelectric cooler is responsive to said external variable control circuit.

4. The electrometer system of claim 3 in which said thermal insulating means includes a tetrafluoroethylene (TFE) insulating blanket enclosing an electrometer housing, a layer of thermal insulation wrapped around said TFE insulating blanket in such a manner as to envelop said TFE insulating blanket, and a means for insulating said receiving means and said transmitting means.

5. A method for measuring small currents employing said electrometer system comprising:

selecting a temperature for the operation of said electrometer circuit;

inputting said selected temperature to said external variable temperature control circuit;

sensing the temperature of the electrometer circuit by means of said resistance temperature detector which is responsive to the temperature of said electrometer circuit and its environment;

activating said thermoelectric cooler in response to said external variable temperature control circuit where said thermoelectric cooler removes heat from said conducting member and yields heat to said heat sink.

* * * * *